(12) United States Patent
Weingarten et al.

(10) Patent No.: US 8,964,464 B2
(45) Date of Patent: Feb. 24, 2015

(54) SYSTEM AND METHOD FOR ACCELERATED SAMPLING

(75) Inventors: Hanan Weingarten, Herzelia (IL); Erez Sabbag, Kiryat Tivon (IL)

(73) Assignee: Densbits Technologies Ltd., Haifa (IL)

( * ) Notice: Subject to any disclaimer, the term of this patent is extended or adjusted under 35 U.S.C. 154(b) by 753 days.

(21) Appl. No.: 13/214,485

(22) Filed: Aug. 22, 2011

(65) Prior Publication Data

US 2012/0051144 A1 Mar. 1, 2012

Related U.S. Application Data

(60) Provisional application No. 61/376,584, filed on Aug. 24, 2010.

(51) Int. Cl.
| | | |
|---|---|---|
| G11C 11/34 | (2006.01) | |
| G11C 16/04 | (2006.01) | |
| G11C 11/56 | (2006.01) | |
| G11C 16/26 | (2006.01) | |

(52) U.S. Cl.
CPC ............ *G11C 11/5642* (2013.01); *G11C 16/26* (2013.01)
USPC ............ 365/185.03; 365/185.24; 365/185.12; 365/185.29

(58) Field of Classification Search
CPC ............... G11C 11/5628; G11C 16/26; G11C 11/5642; G11C 16/3418; G11C 16/349; G11C 16/10; G11C 16/3454
USPC .............. 365/185.03, 185.24, 185.12, 185.29
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |

(Continued)

OTHER PUBLICATIONS

Search Report of PCT Patent Application WO 2009/118720 A3.

(Continued)

*Primary Examiner* — Hien Nguyen
(74) *Attorney, Agent, or Firm* — Dentons US LLP

(57) ABSTRACT

A system and method for reading memory cells in a multi-level cell memory device. A set of thresholds may be received for reading a current page of the memory cells. The set of threshold may include hard decision thresholds for hard decoding, soft decision thresholds for soft decoding, erase thresholds for erase decoding and/or other combinations of thresholds. The set of thresholds may be divided into a plurality of groups of thresholds. The current page may be simultaneously read using multiple thresholds, where each of the multiple thresholds is divided into a different group of thresholds.

21 Claims, 8 Drawing Sheets

(56) References Cited

U.S. PATENT DOCUMENTS

| | | |
|---|---|---|
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,480,176 B2 * | 1/2009 | Kamei ................... 365/185.02 |
| 7,518,923 B2 * | 4/2009 | Mokhlesi ................ 365/185.18 |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |

(56) References Cited

U.S. PATENT DOCUMENTS

| | | |
|---|---|---|
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0195804 A1* | 8/2008 | Kim et al. .................... 711/103 |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0103733 A1* | 4/2010 | Hemink .................. 365/185.03 |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0296350 A1* | 11/2010 | Kim et al. ................ 365/189.15 |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0149657 A1* | 6/2011 | Haratsch et al. ......... 365/185.18 |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |

(56) References Cited

U.S. PATENT DOCUMENTS

| | | |
|---|---|---|
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Serge! Sawitzki, "High-Throughput and Low Power Architectures for Reed Solomon Decoder", (a.kumar at tue.nl, Eindhoven University of Technology and sergei.sawitzki at philips. com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI—Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polanksy, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

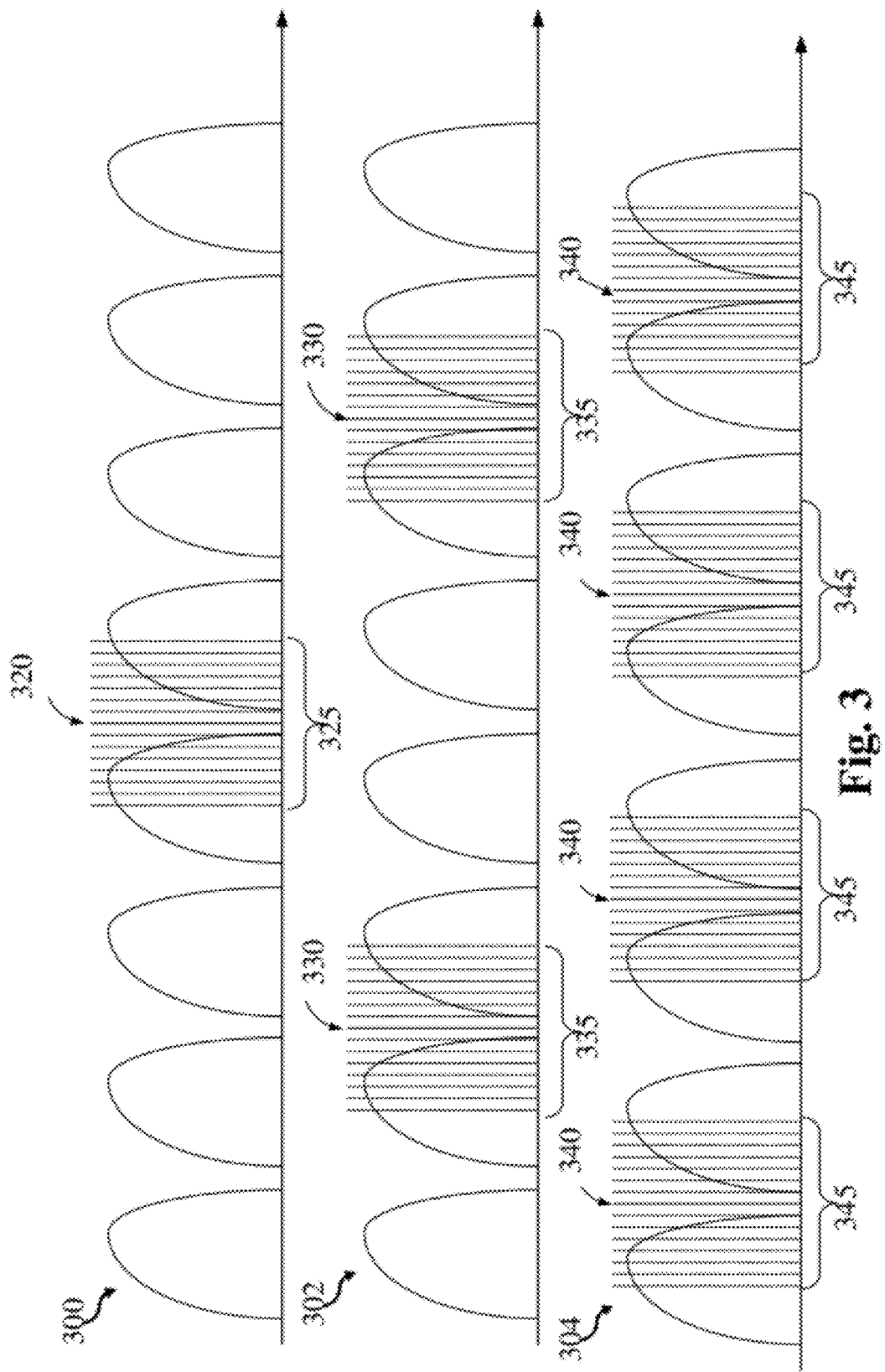

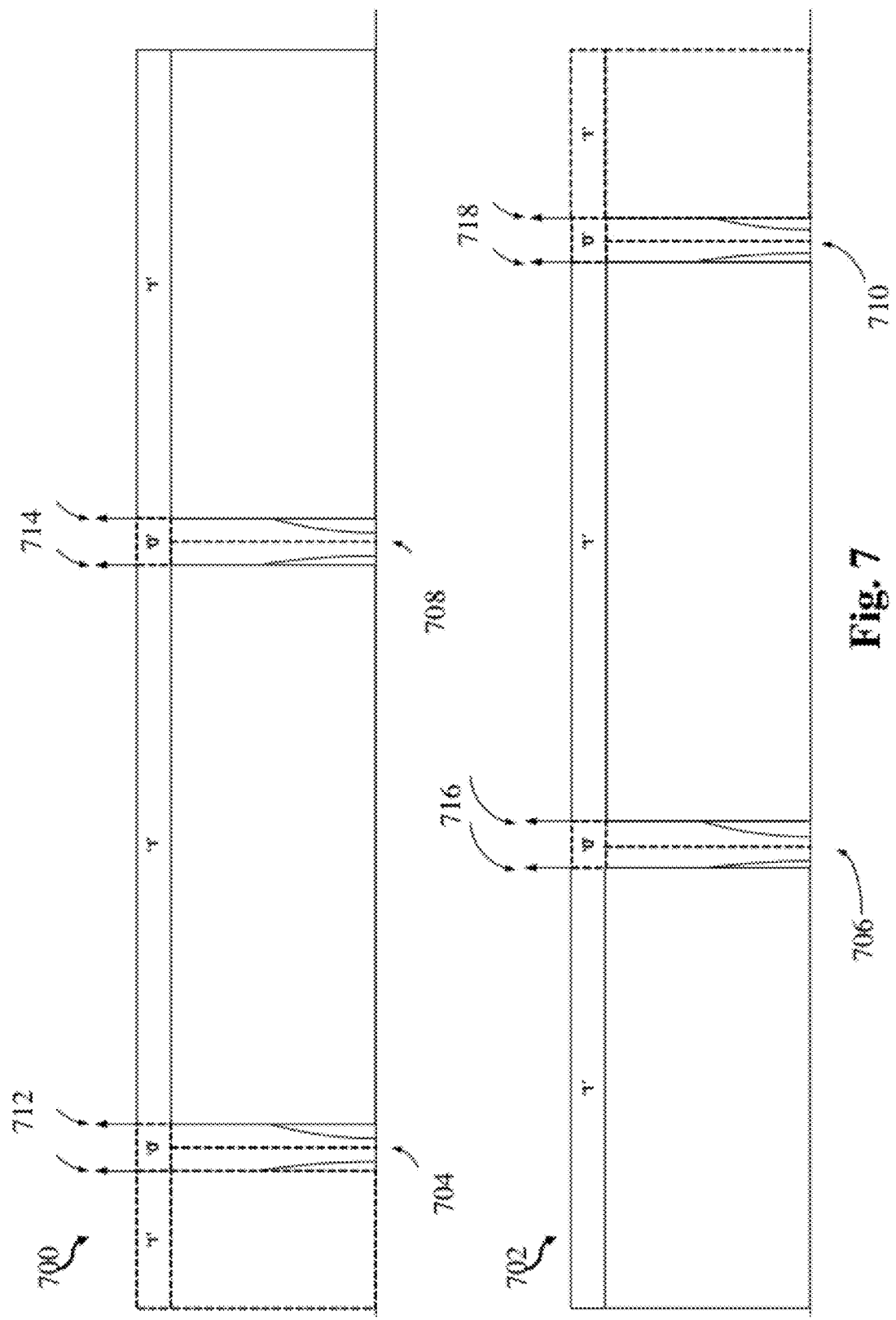

SYSTEM AND METHOD FOR ACCELERATED SAMPLING

REFERENCE TO RELATED APPLICATION

This application claims the benefit of U.S. Provisional Patent Application No. 61/376,584, filed Aug. 24 2010, which is incorporated herein by reference in its entirety.

FIELD OF THE INVENTION

Embodiments of the invention relate to systems and methods for repeated sampling of memory cells using multiple different read thresholds, for example, for soft decoding or erase decoding. In particular, some embodiments relate to accelerating multi-threshold sampling.

BACKGROUND OF THE INVENTION

Memory cells, for example, in a Flash memory device, may be read by sampling the cells with a single initial set of decision thresholds for "hard" decoding. A hard decoder may define each bit of each memory cell to have an exact and definite value, for example, either zero or one. For example, if voltage is induced across a bit using the initial set of hard decision thresholds, the bit may be considered to be definitely a one (otherwise the bit may be considered to be definitely a zero).

In addition to the hard bit information defining the bit value (e.g., 0 or 1), "soft" decoders and "erase" decoders may provide additional "soft" bit information, for example, providing a measure of the certainty or reliability that the bit value is correct. To obtain the soft bit information, the memory cells may be sampled or read repeatedly using, not only the initial set of hard decoding threshold(s), but also multiple additional soft decoding thresholds surrounding each hard decoding threshold to determine how close the voltage is to the hard decoding threshold. Similarly, an erase decoder may define "erase bits," which may indicate whether the hard bit information is reliable or not by sampling the cells in a voltage window using a pair of thresholds positioned at an upper and lower voltage limit for each hard decision threshold.

Repeatedly sampling the same set of cells at staggered thresholds may provide additional soft information about the reliability of the values read at those cells to reduce decoding errors and enhance read reliability. However, since each sampling operation uses a separate read cycle, repeatedly sampling the same set of cells in soft or erase decoding may use significantly more time and resources than the single sampling operation used in hard decoding.

There is a growing need in the art for systems and methods to reduce the duration of multiple sampling read operations for soft decoding and erase decoding.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 is a schematic illustration of PDFs of a set of memory cells and corresponding soft decision thresholds for soft decoding each page of the set of cells;

FIG. 7 is a schematic illustration of a sampling mechanism for simultaneously sampling multiple thresholds for erase decoding according to an embodiment of the invention.

Figure 1:
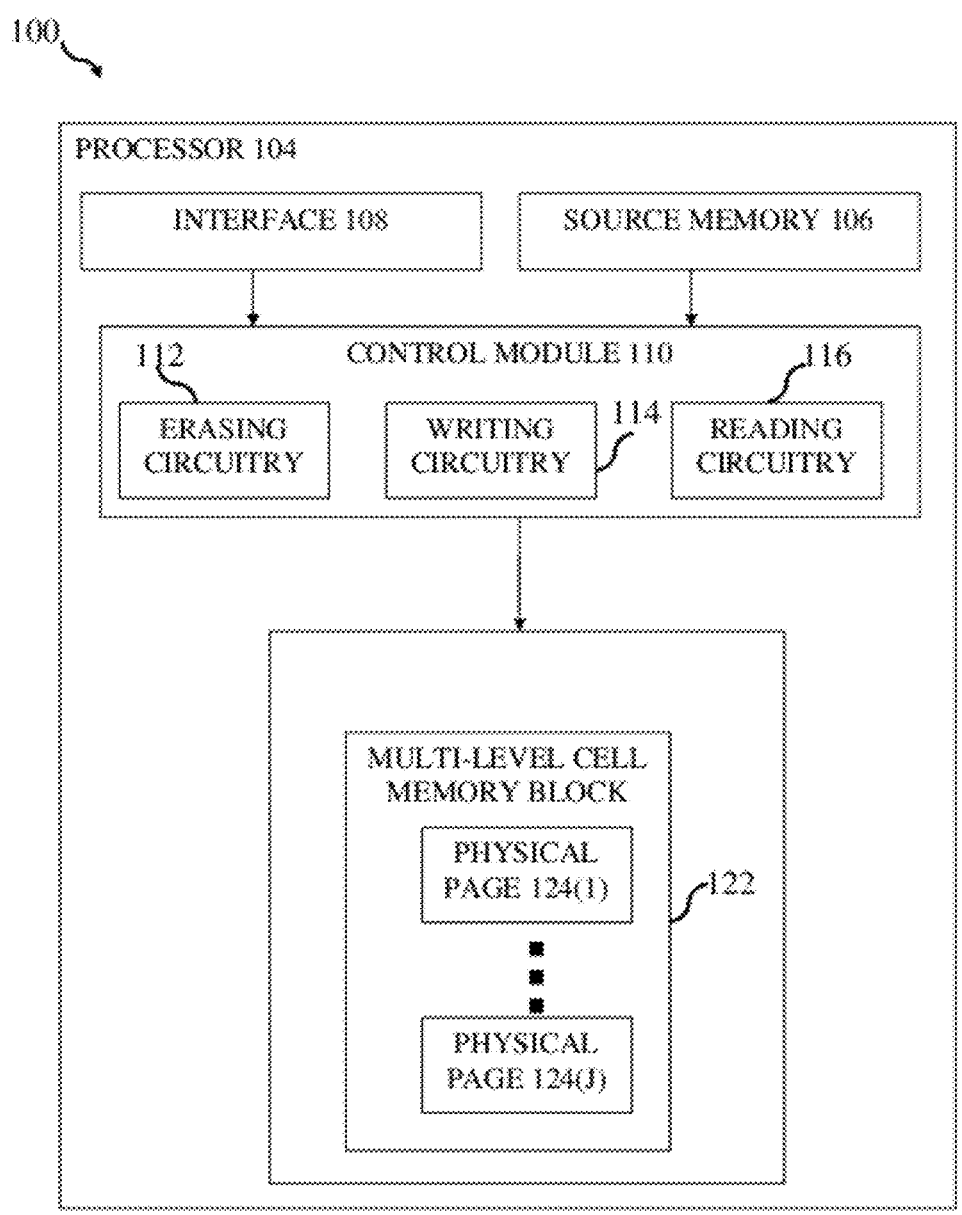
FIG. 1 is a schematic illustration of a system for reading and/or programming a memory unit according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the invention may accelerate the repeated sampling of memory cells. Instead of conventional multi-threshold samplings that use a single read threshold for each separate read instruction, embodiments of the invention may combine read thresholds to read a set of cells using multiple thresholds using a single read instruction. The single read instruction may read the cells simultaneously using the multiple thresholds, for example, in a single read operation or single memory access.

The set of cells may be sampled multiple times around each hard decision threshold to obtain soft information related to the error or reliability associated with that hard decision threshold. Different numbers of hard decision thresholds may be used (e.g., one to read a one-bit page, two to read a two-bit page, four to read a three-bit page, and so on) and different numbers of soft decision thresholds may surround each hard decision threshold (e.g., two thresholds for erase decoding and an integer number (P) of two or more thresholds for (P)-bit resolution soft decoding) to yield any total number of sampling thresholds (N). In one embodiment, to sample cells (N) times using the multi-(N) thresholds, thresholds may be clustered into groups surrounding each hard decision threshold. Each combined sampling or read operation may combine a single threshold from each group surrounding each different hard decision threshold (e.g., combining N thresholds to read an N-bit page). In one embodiment, a "comb" sampling technique may be used in which a threshold from each cluster (or group) may be a "tooth" or tip of the comb to be sampled together (e.g., in the same read cycle) using the same sampling instruction. Each sequential read instruction may perturb or shift the "comb" by a voltage step to iteratively read the next set of thresholds from each hard decision group, until the cells have been read using all thresholds in each hard decision group to complete the multi-sampling read operation. Other arrangements or groupings of multiple thresholds may be used. Hard decision thresholds may be grouped and sampled together with soft decision thresholds in the combined instructions or, alternatively may be handled separately in separate hard decision instructions.

For a multi-(N) threshold sampling, combining multiple (M) thresholds into each read instruction may reduce the total number of cycles used to read memory cells, for example, from (N) cycles in conventional single threshold sampling systems to (N/M) cycles according to embodiments of the invention. Such a reduction in read instruction cycles may accelerate reading the cells to generate a more efficient memory system.

Reference is made to FIG. 1, which schematically illustrates a system 100 for reading and/or programming a memory unit 102 according to an embodiment of the invention.

System 100 may include a computer device capable of executing a series of instructions to write, read, modify, erase, store, save, recover, process, encode, decode, compute, edit, receive, transfer, display, or otherwise use or manipulate data. System 100 may include one or more computers, workstations, cellular device, tablet devices, personal digital assistants (PDA), video game consoles, etc. In one embodiment, system 100 may be a computer and memory 102 may be a flash memory device.

System 100 may include a processor 104 to receive one or more instruction(s), for example, via a program interface 108 to read, write, and/or erase data from a source memory 106 to memory unit 102. Processor 104 may include a control module 110 having erasing circuitry 112, writing circuitry 114 and reading circuitry 116, for erasing, writing and reading data to memory unit 102, for example, as defined by the received instruction(s). Circuitry 112, 114, 116 may include one or more dedicated hardware units, or processor 104 executing software.

Source memory 106 may be separate from or integral to memory unit 102. An integral source memory 106 may be used to move data within memory unit 102 or as an intermediate temporary storage, for example, used to buffer or queue data written to memory unit 102.

Memory unit 102 may include a non-volatile memory, for example, one or more external drives such as a disk or tape drive, a universal system bus (USB) drive, a solid-state drive, a memory card such as a SD card, a Multi-Media Card (MMC), a network card, an input/output device port or a memory in an internal or external device. Memory unit 102 may include a flash memory, such as, NOR-type flash memory, negated AND (NAND)-type flash memory, or a phase-change random access memory (PRAM). Memory unit 102 may include a volatile memory, for example, buffer memory, cache memory, random access memory (RAM), dynamic RAM (DRAM), scratchpad memory, or other suitable memory units or storage units for direct use by a processor 104. Volatile memory is typically used for short-term storage and non-volatile memory is typically used for long-term storage, although either memory may be used for either short or long term storage.

Memory unit 102 may store data in one or more data blocks 122, each of which may include one or more pages 124 (1)-(J). Each page 124 may include a portion of data (e.g., 512 bytes-8 Kbytes) representing original information and a portion of data (e.g., 16-32 bytes for every 512 data bytes of data) representing error correction data, such as, redundancy and/or back pointers for the original information for correcting errors that may have occurred during a page read or write operation. A plurality of cells of memory unit 102 may be processed together as a page 124 and a plurality of pages may be processed together as a block 122, such as an erase block which is erased in preparation for writing. In some embodiments, cells of memory unit 102 may be erased, for example, block-by-block, but may be written into and/or read from memory unit 102, for example, page-by-page. Other groupings or partitions of data or memory cells may be used.

Memory unit 102 may include a set of multi-level cells. Each cell may include (to an acceptable level of certainty) more than two statistically distinguishable voltage regions or levels, for example, one corresponding to a zero value and at least two or more other regions corresponding to different non-zero values, defining (e.g., $2^N$) binary states for the multiple (e.g., N) bits in each cell. The number (e.g., N) of bits of information in cells of multi-level cell memory unit 102 may be greater than one and may or may not be an integer number.

Processor 104 may receive a write instruction from host interface 108 to write data addressed to memory unit 102. The data may be provided in a corresponding data stream, for example, from source memory 106 or another memory. To write the data, processor 104 may inject electrons between electrically isolated floating-gates in the cells of memory unit 102 in an associated electron configuration. Processor 104 may program a group of cells together, for example, a row of cells in a memory block 122. Each row may be programmed in a sequence of stages one page or one bit at a time. In each sequential programming stage for an $M^{th}$ bit, processor 104 may inject electrons into each cell to induce a voltage in the one of the (e.g., $2^M$) binary bit states defined by the source data for the $M^{th}$ bit.

Processor 104 may receive one or more read instructions from host interface 108 to read a set of cells from memory unit 102, for example, a row of cells in memory block 122. Processor 104 may receive a set of hard decision thresholds for each bit. The hard decision thresholds may divide a voltage range into (e.g., $2^M$) distinguishable voltage ranges corresponding to the (e.g., $2^M$) different states or bit values for the multiple (e.g., M) bits in each cell. Processor 104 may apply current to the set of cells at each hard decision voltage threshold for each bit. The cells that conduct within each voltage range (e.g., for the lower bound threshold, but not for the higher bound threshold) may have a bit value associated with that voltage range.

However, in some cases, these hard bit values may have too many errors for successful decoding. In such cases, a soft decoder or erase decoder may be useful for generating soft bit information. Soft bit information may be generated by sampling the cells multiple times at multiple thresholds surrounding each hard decision threshold to determine the reliability of the hard decisions for that threshold. However, increasing the number of thresholds to sample from one hard decision threshold to multiple soft decision thresholds may increase the time processor 104 uses to read cells from memory unit 102.

Embodiments of the invention may provide a system and method to accelerate the repeated sampling of memory cells by combining multiple thresholds to be sampled by each read instructions. To read a current page of the memory cells from memory unit 102, processor 104 may receive a set of thresholds including one or more hard decision thresholds and/or one or more soft thresholds surrounding each hard decision threshold. Hard decision thresholds are preferably, but not necessarily, optimal (minimizing errors) and soft thresholds do generally, but not necessarily, surround optimal thresholds. Processor 104 may divide the set of thresholds into groups of thresholds, for example, at the hard decision threshold voltages for the same or different pages. Processor 104 may simultaneously read the current page using multiple thresholds, where each of the multiple thresholds is divided into a different group of thresholds. Processor 104 may iteratively repeat reading the current page using different combinations of multiple thresholds until the current page is read with all or a predefined subset of thresholds in the set of thresholds. Each read operation simultaneously using multiple thresholds may be triggered by a single multi-threshold read instruction, which may be native to memory unit 102.

In one example, a Flash memory array such as a NAND Flash memory may be read by sampling an entire page of memory cells (e.g. 32,000 cells) together in each read operation. The cells may be iteratively sampled by setting their floating gates to a variable threshold level, applying a voltage to the page or bit-line and checking whether a current flows through the string of cells (whether the current is above a predefined threshold). This sampling process may be repeated several times to obtain soft bit information, each time with a different variable threshold level. The number of threshold levels sampled may be defined by the resolution of the soft bit information. In one embodiment, soft bit information with N-bit resolution may be generated by sampling cells $2^N-1$ times to create $2^N$ distinct voltage ranges. In the example shown in FIG. 4A, a 5-bit resolution sampling may include $2^5-1=31$ threshold samplings to generate $2^5=32$ distinct voltage ranges. The information read in each of the (e.g., 31) samplings may be stored in a distinct one of the (e.g., 31) memory buffers (e.g., each buffer may have the same size of a page). In another embodiment, an efficient storage system may, for example, use 5 or 6 buffers to store the soft bit information, for example, as described in U.S. patent application Ser. No. 12/667,386, filed Dec. 31 2009, entitled "Flash Memory Apparatus and Methods Using a Plurality of Decoding Stages Including Optional Use of Concatenated BCH Codes And/Or Designation Of "First Below" Cells," which is incorporated herein by reference in its entirety. The soft bit information may be extracted from the data in the buffers.

Embodiments of the invention may reduce the number of individual sampling accesses to the memory unit by combining multiple samplings into a single memory access, for example, using built-in multi-level read instructions. In one example, to generate 5-bit resolution soft bit information of a LSB page in a 3 bit per cell (bpc) memory device, only 9 samples may be used to read the 31 thresholds from the memory unit (7 LSB reads, 1 CSB read, and 1 MSB read), for example, as opposed to 31 samples used in conventional systems. A "comb" technique may be used to sample multiple thresholds together for each page, where all related thresholds are sampled simultaneously (in the same memory access) and then the "comb" tips are moved to a new set of thresholds. The comb tips may be spaced by even or uneven voltage gaps and the spacing may vary for each read operation. Such techniques may use native multi-thresholds read commands available, for example, in NAND flash devices, replacing single thresholds samplings with multi-threshold samplings for as many read instructions as possible. In conventional systems, each native read commands is typically designated to read a specific logical page (e.g., MSB, CSB, LSB) from a physical row. For example, an MSB read command is designated to read an MSB page using a single hard decision threshold, a CSB read command is designated to read a CSB page using two hard decision thresholds, and an LSB read command is designated to read an LSB page using four hard decision thresholds. Each native read command uses the exact number of hard decision thresholds to obtain hard bits from the corresponding designated page. Conventional systems provide no multi-threshold commands for soft decoding. That is, to read a page with an N-bit soft sampling, conventional systems use N separate single threshold commands. In contrast, embodiments of the invention may repurpose the native multi-threshold read commands to read with multiple soft decision thresholds for soft decoding any (designated or non-designated) page. In one embodiment, read commands designated for relatively higher-bit pages with a relatively greater number of thresholds may be used as the multiple soft decision thresholds to read the soft bit information of relatively lower-bit pages. For example, a 4-threshold LSB read command (pre-designated for hard decoding an LSB page) may be used according to embodiments of the invention to soft sampling an MSB page with 4 soft decision thresholds. In another example, 1-threshold MSB read command and 2-threshold CSB read command may be used during soft sampling of an LSB page. By using the multi-threshold read commands to simultaneously read using groups or clusters of soft decision thresholds, embodiments of the invention may dramatically reduce the soft sampling read duration compared to the single threshold commands of conventional systems.

Figure 2:
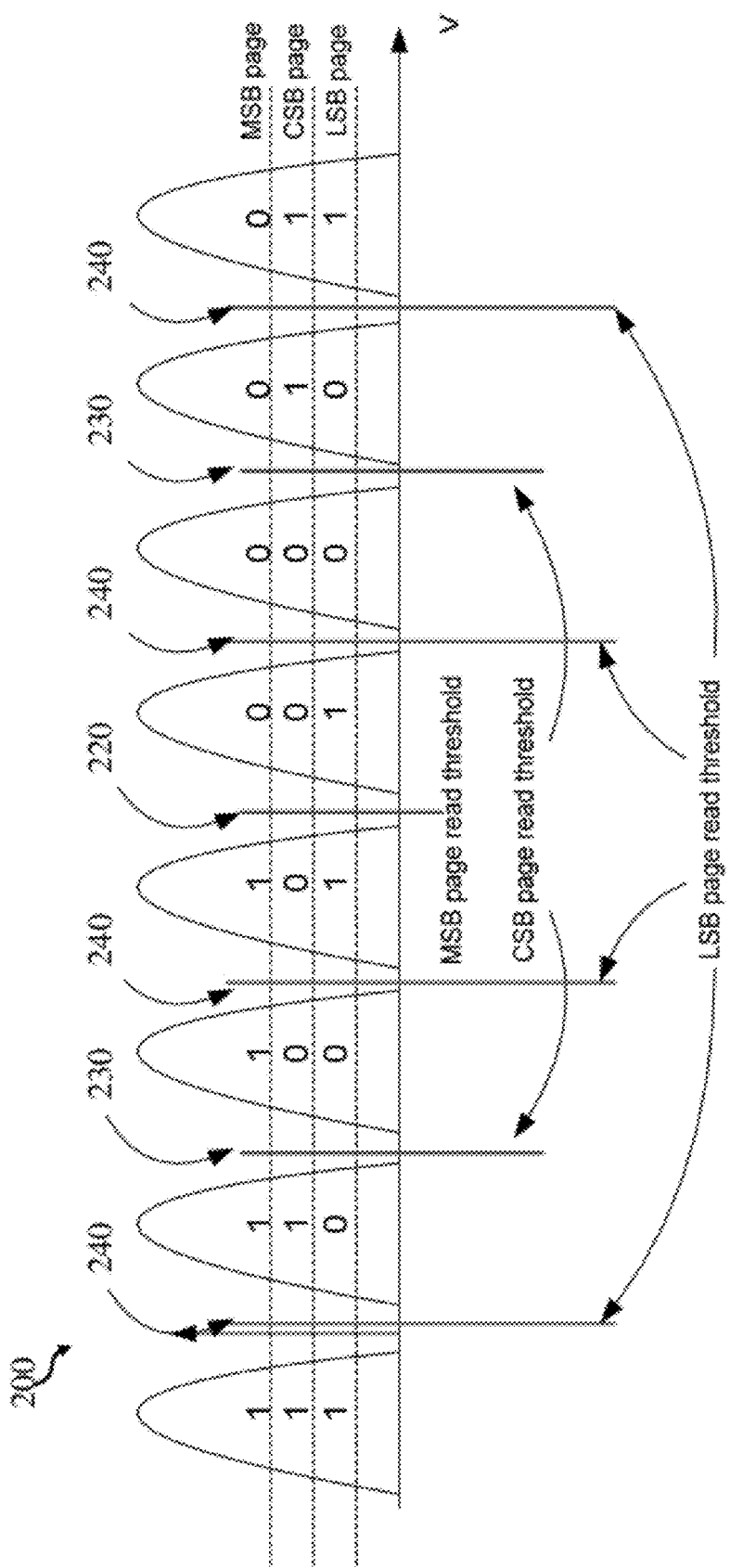
FIG. 2 is a schematic illustration of a probability distribution function (PDF) of a set of memory cells and corresponding hard decision thresholds for hard decoding the set of cells.

Reference is made to FIG. 2, which schematically illustrates a probability distribution function (PDF) 200 of a set of memory cells and corresponding hard decision thresholds for hard decoding the set of cells. In the example of FIG. 2, a 3 bpc memory is described storing cell data in a most-significant bit (MSB) page, a center significant bit (CSB) page, and a least-significant bit (LSB) page, although other numbers of bits per cell or arrangements of pages may be used.

PDF 200 may define the probability of the voltage profile for the set of cells. Each cell has a specific threshold voltage value above which the cell conducts. PDF 200 plots a histogram of these threshold values. PDF 200 may include a plurality of (e.g., $2^3=8$) lobes, each associated with a different one of the (e.g., $2^3$) voltage program levels. Each lobe may define a voltage range (e.g., or uncertainty) centered about some voltage value for each program level. Any cells that conduct a minimum threshold voltage value in that range may be assigned the bit value of the corresponding program level.

The mapping between lobes and the values for the 3 information bits is marked on each lobe as a combination of zeros and ones in FIG. 2.

The lobes may be divided by read thresholds 220, 230, 240, defining the boundary voltages of the lobes. Read thresholds 220, 230, 240 may be divided into three sets: threshold 220 for reading the MSB page, thresholds 230 for reading the CSB page, and thresholds 240 for reading the LSB page. The MSB page (e.g., defining a $1^{st}$ bit) may be read using only the single read threshold 220. Cells with a threshold voltage less than read threshold 220 (e.g., to the left of threshold 220) may be read as "1", while cells with a threshold voltage greater than (or equal to) read threshold 220 (e.g., to the right of threshold 220) may be read as "0". The CSB page (e.g., defining a $2^{nd}$ bit) may be read using read using two read thresholds 230. Cells with a threshold voltage less than the first threshold 230 and above the second threshold 230 may be read as "1", while cells between the first and second thresholds 230 may be read as "0". The LSB page (e.g., defining a $3^{rd}$ bit) may be read using four read thresholds 240. Cells with a threshold voltage less than the first threshold 240, between the second and third thresholds 240 and above the fourth threshold 240 may be read as "1", while cells between the first and second thresholds 240 and between the third and fourth thresholds 240 may be read as "0". These thresholds 220, 230, 240, which define the bit values of the cells, may be referred to as hard decision thresholds.

Although the lobes of PDF 200 are non-overlapping in FIG. 2, this figure is a schematic illustration and the lobes may overlap in practical applications. The overlap of lobes may be intentional, for example, used to achieve high programmed speed, or unintentionally, for example, due to a retention effect. The overlap of lobes associated with different bit values may cause read errors to occur even when the hard decision thresholds are optimally placed. To detect and correct such errors, in addition to the hard decision threshold samplings in FIG. 2 and/or hard decoding based error correction code (ECC), additional samplings may be executed with soft decision thresholds, for example, as described in reference to FIG. 3, for example, to facilitate soft decoding based ECC Reference is made to FIG. 3, which schematically illustrates PDFs 300, 302, and 304 of a set of memory cells and corresponding soft decision thresholds for soft decoding each page of the set of cells. In the example of FIG. 3, a 3 bpc memory is described storing cell data in MSB, CSB, and LSB pages, although other numbers of bits per cell or arrangements of pages may be used. PDFs 300, 302, and 304 are overlaid with thresholds for reading the MSB, CSB, and LSB pages of the set of cells, respectively.

To read the MSB page of the cells, a soft decoder may sample a hard decision threshold 320 (e.g., hard decision threshold 220 of FIG. 2) and an associated set of multiple surrounding soft thresholds 325, for example, as shown in PDF 300. In the example of FIG. 3, 15 thresholds are read to determine the soft bit information for the MSB page.

Similarly, to read the CSB page of cells, a soft decoder may sample two hard decision thresholds 330 (e.g., hard decision thresholds 230 of FIG. 2) and a set of multiple soft thresholds 335 surrounding each hard decision threshold 330, for example, as shown in PDF 302. In the example of FIG. 3, 30 thresholds are read to determine the soft bit information for the CSB page.

To read the LSB page of cells, a soft decoder may sample four hard decision thresholds 340 (e.g., hard decision thresholds 240 of FIG. 2) and a set of multiple soft thresholds 345 surrounding each hard decision threshold 340, for example, as shown in PDF 304. In the example of FIG. 3, 60 thresholds are read to determine the soft bit information for the LSB page.

The number of soft thresholds and their voltages are used here as non-limiting examples and they may be set or changed according to desired functionality and system performance.

To accelerate soft sampling, embodiments of the invention may combine thresholds to simultaneously sample a set of cells using multiple thresholds read operation. A "comb" technique may be used to select each set of thresholds to combine, where each "tooth" of the comb represents a different sampling threshold to be sampled simultaneously. The thresholds combined in each read operation may each be designated to or labeled in a different threshold group, as described in reference to FIG. 4A. The labeling of thresholds into groups may define which thresholds are sampled together.

Native multi-read commands may be used to simultaneously sample the multiple thresholds for each bit-type (e.g., within each MSB, CSB, and LSB page). Multiple bit-types may be sampled separately (sequentially) or alternatively, together (in parallel), where for example, in each read operation 1, 2, and 4 thresholds may be read in parallel for the MSB, CSB, and LSB pages, respectively.

Systematic "Comb" Sampling

Figure 4A:
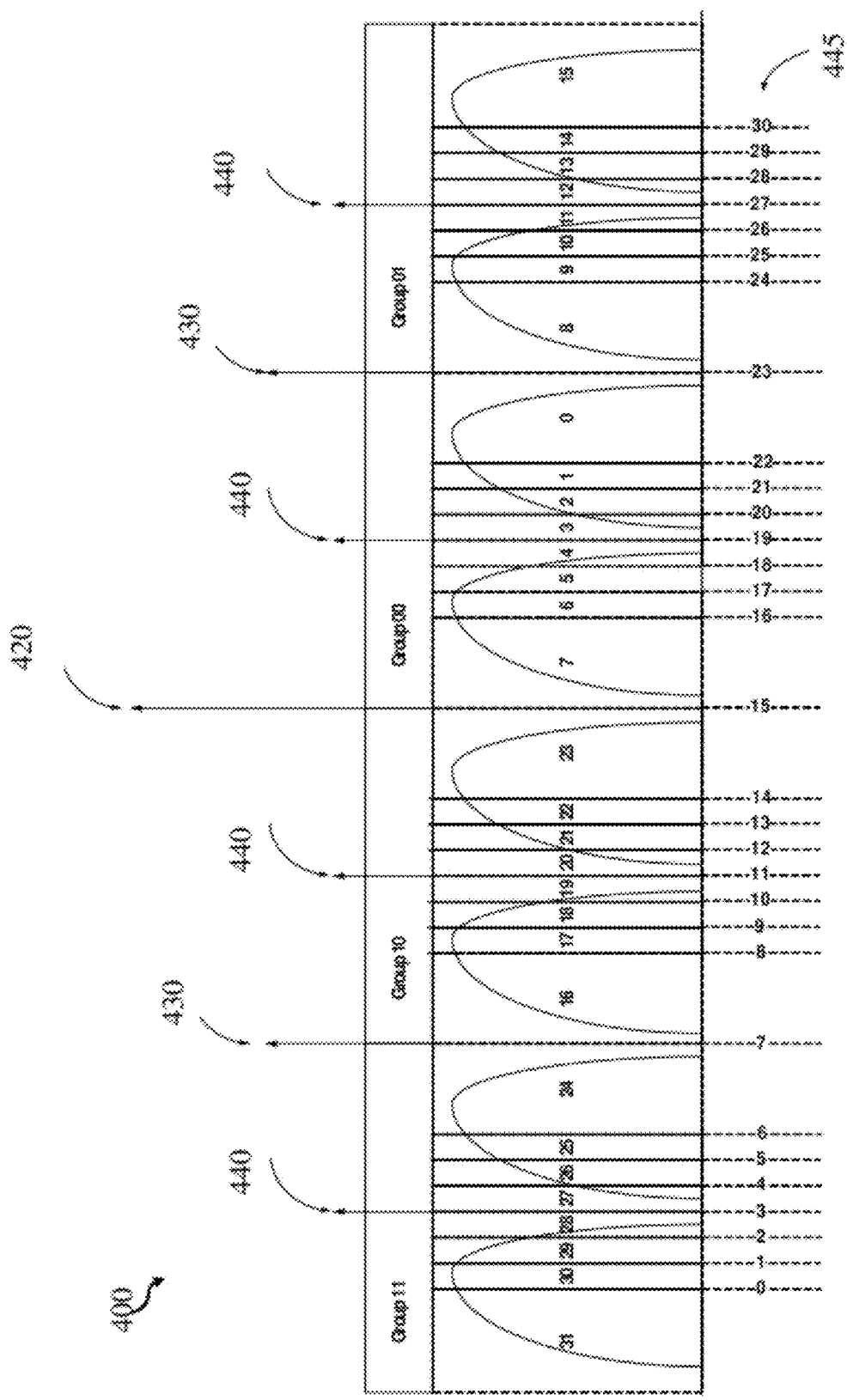
FIG. 4A is a schematic illustration of a partition of (e.g., 5-bit resolution) soft decision read thresholds into groups for simultaneously reading (e.g., an LSB page of) a set of memory cells using multiple thresholds, each from a different group, according to an embodiment of the invention.

Reference is made to FIG. 4A, which schematically illustrates a partition of soft decision read thresholds into groups for simultaneously reading a set of memory cells using multiple thresholds, each from a different group, according to an embodiment of the invention. The example of FIG. 4A shows a partition labeling groups of thresholds for an LSB page in a 3 bpc memory for sampling with 5-bit resolution, although other pages (e.g., MSB, CSB), other bits-per-cell (e.g., 2 or 4 bpc) and/or other resolutions (e.g., 4 or 6-bit resolution) may be used. A soft decoder may access a set of soft thresholds 445 including and/or surrounding each hard decision threshold, for example, thresholds 420, 430, 440, for reading MSB, CSB, and LSB pages, respectfully.

PDF 400 may be partitioned into a plurality of threshold groups or ranges for a current page, for example, grouping cells with voltage thresholds in the same voltage range, such as, [r0,r1], [r1,r2], etc. The threshold groups may be divided at hard threshold voltages 420 and 430 (e.g., for lower bit MSB and CSB pages). These threshold groups may be sampled simultaneously using multi-level read instructions, for example, combining a single threshold from each group. For example, to sample the 3 bpc memory with 5-bit resolution of FIG. 4A, a set of for example 31 ordered thresholds may be received (the threshold indices are marked at the bottom of each bin in FIG. 4A). The 31 LSB thresholds may be divided into 4 groups using 3 hard thresholds, for example, one hard threshold 420 used to read the MSB page (e.g., index 15) and two hard thresholds 430 used to read the CSB page (e.g., indices 7 and 23). Each group may be labeled as the value of the bits defined in one or more other pages. For example, bits which are in the first group ("Group 11") may have been read as '1' during the MSB read and '1' during the CSB read and are thus labeled, for example, as '11'. The group values ('11', '10', '00', '01') may be used as the most-significant-bit of each cell label (or any other bit(s) or location of the labels).

Once the thresholds are divided into groups using labels, one threshold from each group may be sampled simultaneously. For each sampling, the LSB thresholds may be iteratively set while the MSB threshold (index 15) and CSB thresholds (indices 7 and 23) are fixed.

Figure 4B:
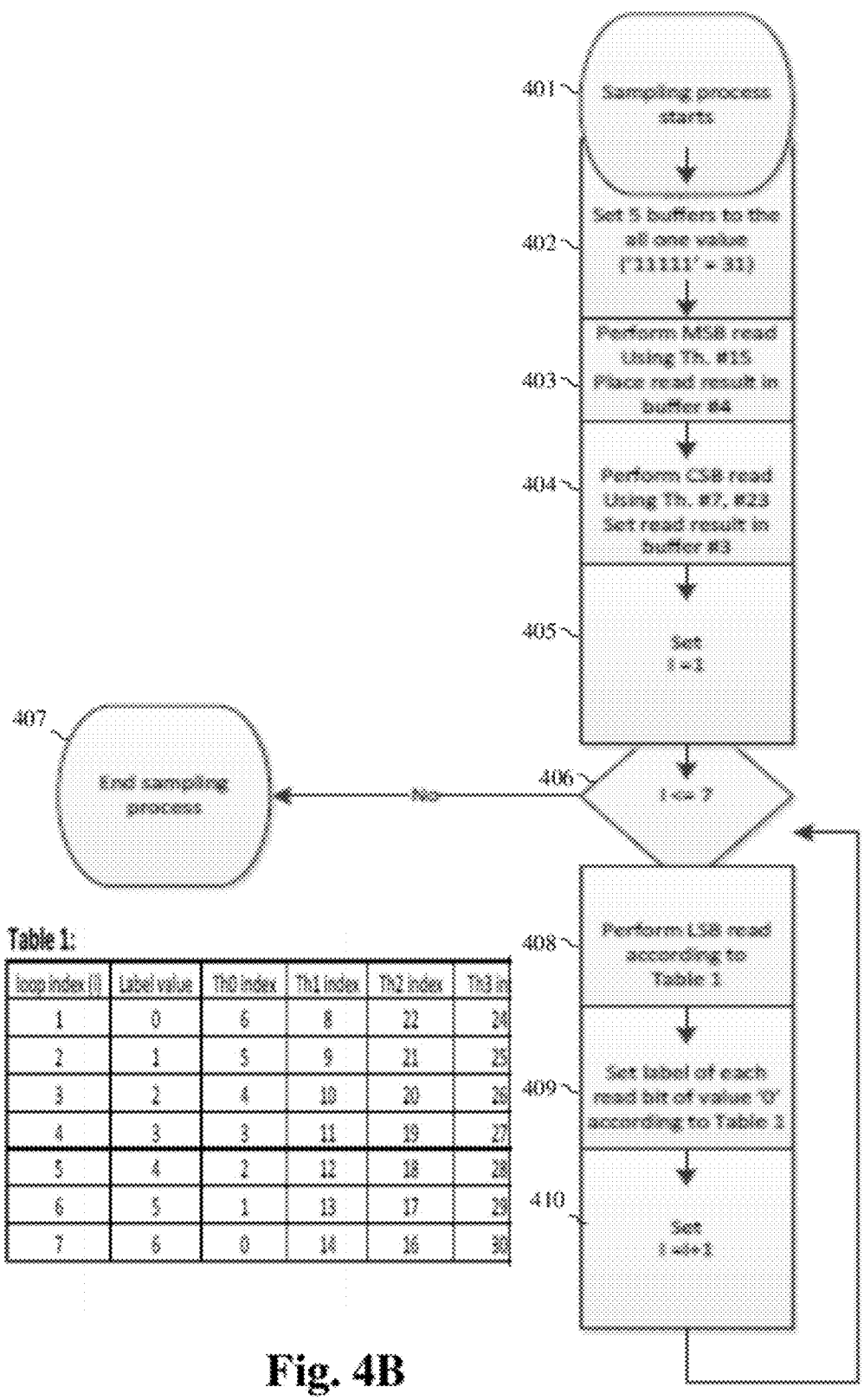
FIG. 4B is a flowchart of a method for simultaneously reading a set of memory cells using multiple thresholds, each from a different group, as partitioned in FIG. 4A, according to an embodiment of the invention.

Reference is made to FIG. 4B, which is a flowchart of a method for simultaneously reading a set of memory cells using multiple thresholds, each from a different group, as partitioned in FIG. 4A, according to an embodiment of the invention.

A sampling process (initiated in operation 401) may set all labels or buffers, for example, to a value '11111' (=31) (operation 402). The MSB and CSB pages may be read using MSB threshold (threshold index 15) and CSB thresholds (threshold indices 7 and 23), respectively (operations 403 and 404). The read results may be stored in respective buffers (buffer indices 4 and 3, respectively). The MSB and CSB pages may be read as the most-significant-bit of the label reorientation (representing the group index in this example, i.e., group 11, 10, 00 or 01). After the MSB and CSB pages are read, a first iterative loop (i=1) or sampling of the LSB page may initiate (operation 405). If the iterative sampling has an index (i) less than or equal to a maximum sampling number (e.g., 7), the sampling may proceed (to operation 408); otherwise the sampling may end (operation 407). The LSB page may be sampled in a first sampling iteration (index i=1) using the set of thresholds for sampling index (i=1) (operation 408). The sampling thresholds for index (i=1) may be for example, threshold indices 6, 8, 22, and 24, from groups 11, 10, 00, and 01, respectively (listed in row 1 of Table 1). The lower 3-bit label value of cells read in this phase which has a read value '0' are assigned with '000' (=0) (operation 409). Next, the sampling iteration may be incremented to index i+1 (operation 410) and LSB thresholds may be re-set accordingly to thresholds for index i+1. The sampling thresholds for index (i+1) may be for example, threshold indices 5, 9, 21, and 25 from groups 11, 10, 00, and 01, respectively (listed in row 2 of Table 1). The LSB page may be re-sampled using the re-set thresholds (operation 408). Again, all cells with lower 3-bit label value equal to '111' and which read as '0' their lower 3-bit label value is assigned as '001' (=1) (operation 409). The process is continued by incrementing the sampling iteration until the lower 3-bits is assigned the value '110' (=6), for example, after which the sampling iteration may be incremented above the maximum sampling index (e.g., 7) (operation 410). The rest of the bits have already been assigned the initial value '111' (=7). At this stage, each label may include two sets of bits: one set indicating the group index (for the relatively upper bit(s)) and the other set indicating the 3-bit value or bin number of that group. An upper or higher bit may refer to a more significant bit. For example, upper bits for LSB pages may include CSB and MSB bits, upper bits for CSB pages may include MSB bits, and MSB pages typically have no upper bits since they are the first bits to be programmed.

The total time used to execute this sampling is equals to T_MSB+T_CSB+7*T_LSB where T_MSB is the duration for reading a MSB page, T_CSB is the duration for reading a CSB page and T_LSB is the duration for reading a LSB page.

Embodiments of the invention may include one or more of the following properties:
  i. The values of the labels may be chosen so that the label value includes the group value.
  ii. The hard read bit of the page may be placed in a fixed position in the label value. In the above example, the LSB hard bit may be the third bit in each label value. For example, label value 4=00100$_2$, so the hard LSB bit of all cells having a label value of 4 is '1'.
  iii. Different sets of labels may be assigned that satisfy properties (i) and (ii).

iv. The sampling process may use all/partial multi-read instructions and may sample the cells simultaneously and in a systematic manner given pre-defined soft thresholds.
  v. Each pair of adjacent thresholds simultaneously read in each multi-read instruction may be equally spaced and/or differently spaced. The spacing or voltage gap between two adjacent thresholds in each multi-read instruction may be a selected input. When the thresholds are equally spaced, the input may define the exact voltage gap between each pair of adjacent thresholds, whereas when the thresholds are unevenly spaced, the input may define a maximum voltage gap between adjacent thresholds.

Figure 5:
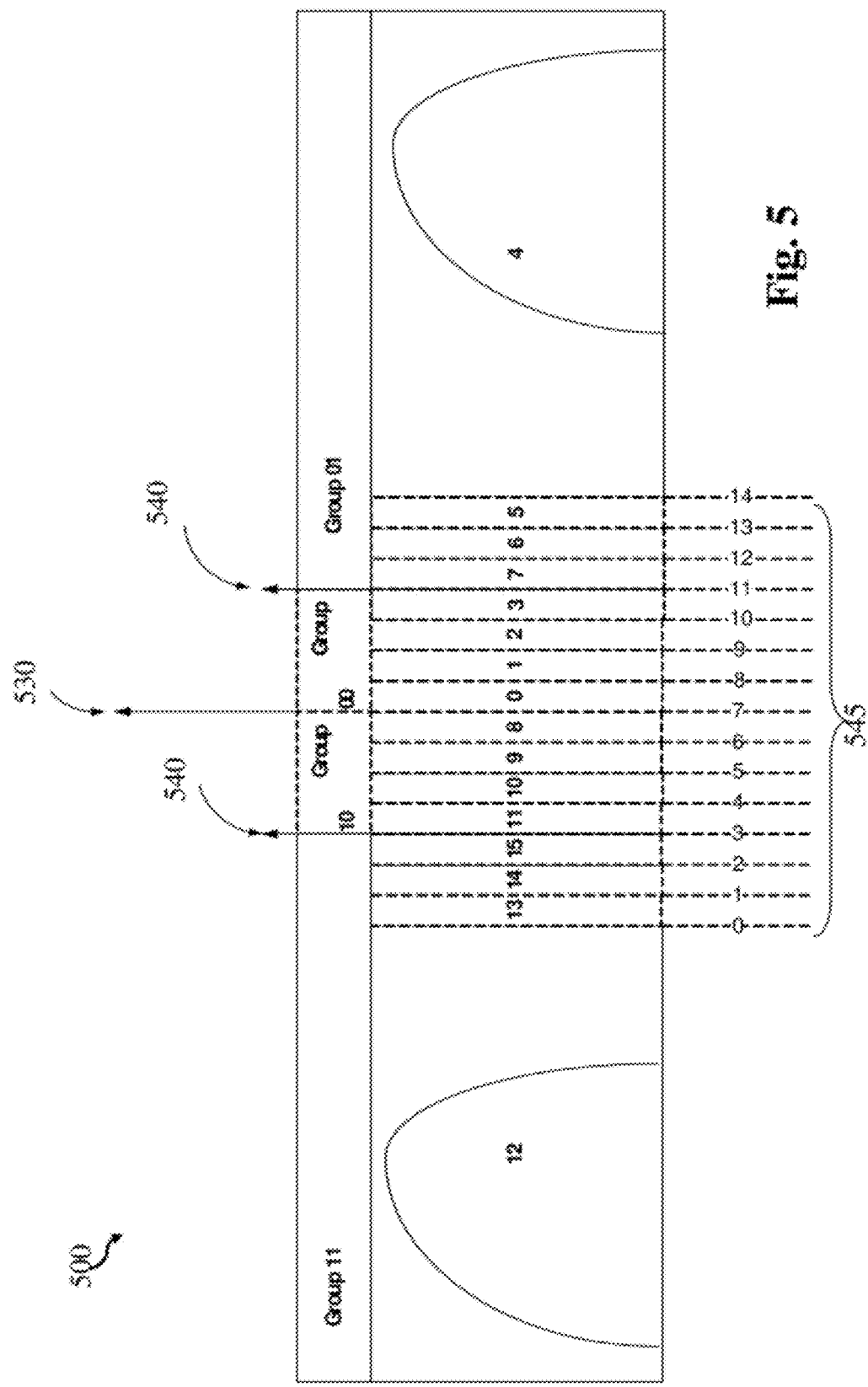
FIG. 5 is a schematic illustration of a partition of (e.g., 4-bit resolution) soft decision read thresholds into groups for simultaneously reading (e.g., an MSB page of) a set of memory cells using multiple thresholds, each from a different group, according to an embodiment of the invention.

Embodiments described in reference to FIG. 4A for sampling an LSB page with a 5-bit resolution may be adapted to sample an MSB page with a 4-bit resolution, for example, as described in reference to FIG. 5. Embodiments described in reference to FIG. 4A may also be adapted for purposes other than soft decoding, for example, for generating a histogram of cells that conduct near a set of read thresholds to estimate optimal read thresholds as described in U.S. patent application Ser. No. 12/596,438, filed Oct. 18 2009, entitled "System and Methods Employing Mock Thresholds to Generate Actual reading Thresholds in Flash Memory Devices," which is incorporated herein by reference in its entirety.

Reference is made to FIG. 5, which schematically illustrates a partition of soft decision read thresholds into groups for simultaneously reading a set of memory cells using multiple thresholds, each from a different group, according to an embodiment of the invention. The example of FIG. 5 shows a partition labeling groups of thresholds for an MSB page in a 3 bpc memory for sampling with 4-bit resolution, although other pages, bits-per-cell and/or other resolutions may be used. A soft decoder may access a set of soft thresholds 545 including and/or surrounding each hard decision threshold, for example, thresholds 520, 530, 540, for reading MSB, CSB, and LSB pages, respectfully.

Given the set of soft thresholds 545 (indicated by the indices at the bottom of FIG. 5), the MSB and CSB pages may be read to partition the thresholds into the group indices 11, 10, 00, and 01. All lower 2-bit labels may be initialized to the value '00'.

Next, a set of 3 LSB reads may be used to read the set of cells. In a first LSB read operation, the cells may be read using a first set of four thresholds (e.g., indices 2, 4, 10, 12) and label value '11' may be assigned to all bits read with value '0'. In a second LSB read operation, the cells may be read using a second set of four thresholds (e.g., indices 1, 5, 9, 13) and label value '10' may be assigned to all bits read as '0'. In a third LSB read operation, the cells may be read using a third set of four thresholds (e.g., indices 0, 6, 8, 14) and label value of '01' may be assigned to all bits read as '0'. In this example the hard MSB bit may be defined by the fourth bit of the label value. The total number of read instructions used for a 4-bit soft sampling of an MSB page is 5 (e.g., 1 MSB read instruction, 1 CSB read instruction and 3 LSB read instructions), for example, a significant (three-fold) reduction from the 15 MSB read instructions conventionally used.

Simultaneously Evaluating the Number of Cells Found in a Set of Bins

The "comb" sampling mechanism may also be used to simultaneously calculate the number of cells in a set of bins. Each bin may define a continuous range of threshold voltages bound by upper and lower voltage values. Cells in a bin may change their conductance when induced by a voltage in the associated voltage range.

Figure 6:
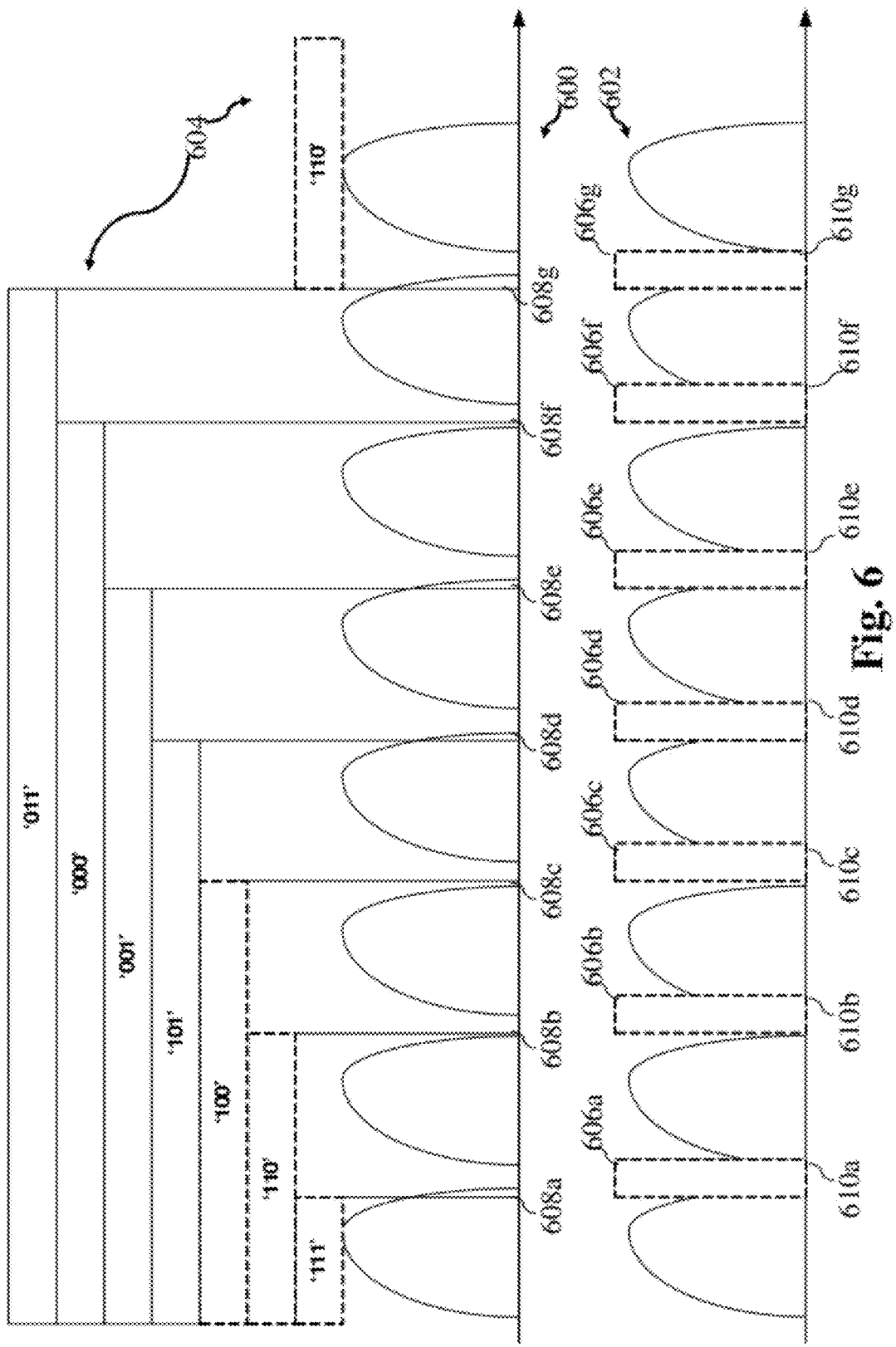
FIG. 6 is a schematic illustration of a sampling mechanism for simultaneously computing the number of cells in multiple bins according to an embodiment of the invention.

Reference is made to FIG. 6, which schematically illustrates a sampling mechanism for simultaneously computing the number of cells in multiple bins 606a-g according to an embodiment of the invention. The example of FIG. 6 shows PDFs 600 and 602 for computing the number of cells in each of 7 bins 606a-g in a 3 bpc memory using MSB, CSB, and LSB read instructions, although other numbers of bins, bits-per-cell and read instructions may be used.

In an initial stage shown in PDF 600, each sequentially ordered read threshold 608a-g may be set to a lower voltage value of a respective sequential one of bins 606a-g. For example, the MSB threshold 608d may be the lower voltage value of the $4^{th}$ bin 606d, the CSB thresholds 608b,f may be the lower voltage values of the $2^{nd}$ and $6^{th}$ bins 606b,f, and the LSB thresholds 608a,c,e,g may be the lower voltage values of the $1^{st}$, $3^{rd}$, $5^{th}$, and $7^{th}$ bins 606a, c, e, g.

Once thresholds 608a-g are set to these lower values, each page (e.g., MSB, CSB and LSB pages) may be read at those thresholds 608a-g and the results may be stored, for example, in a designated buffer. Later, the number of pages found in each group may be counted for the eight groups (000, 001, 010, 011, 100, 101, 110, 111), as shown in group numbers 604. To determine the number of cells in group '101' the number of cells may be counted simultaneously that have an MSB value of '1', a CSB value of '0', and a LSB value of '1'. Counting may be executed using a dedicated piece of hardware or, for example, by a processor executing software. The number of cell in each group may be saved and respectively denoted, for example, as (SL0, SL1, SL2, SL3, SL4, SL5, SL6, SL7).

In a subsequent stage shown in PDF 602, each sequentially ordered read threshold 610a-g may be set to an upper voltage value of a sequential one of bins 606a-g. For example, the MSB threshold 610d may be the upper voltage value of the $4^{th}$ bin 606d, the CSB thresholds 610b,f may be the upper voltage values of the $2^{nd}$ and $6^{th}$ bins 606b,f, and the LSB thresholds 610a,c,e,g may be the upper voltage values of the $1^{st}$, $3^{rd}$, $5^{th}$, and $7^{th}$ bins 606a,c,e,g. Once thresholds 610a-g are set, each (e.g., MSB, CSB and LSB) page may be read at those thresholds and the results may be stored in a designated buffer, the number of cells in each group may be counted and these numbers may be saved, for example, as (SH0, SH1, SH2, SH3, SH4, SH5, SH6, SH7).

Once the upper and lower limit cell counts are known, the number of cell in each jth bin may be computed, for example, as the difference between the number of cells counted using the upper and lower threshold values:

$$\Delta Sj = |SHj - SLj|.$$

In some embodiments, the upper and lower limits may be exchanged so as the value of the upper limit is less than the value of the lower limit

Erasure Sampling

Erasure sampling may use two (or more) thresholds defining a voltage window surrounding each hard decision threshold to identify the cells in that range (e.g., erase value=1; otherwise erase value=0). Identifying these cells may also be valuable for other types of decoding mechanisms, such as, generalized minimum distance (GMD) decoding, low-density parity-check (LDPC) decoding, etc. Erasure bits may be generated for example when the exact value of a corresponding bit cannot be determined with sufficiently high confidence. In such embodiments, the erase bit may provide an indication of the confidence of the corresponding bit. The cells in each hard decision voltage window may be identified as described in reference to FIG. 7 by adapting embodiments described in reference to FIG. 6 for identifying cells in each bin.

Reference is made to FIG. 7, which schematically illustrates a sampling mechanism for simultaneously sampling multiple thresholds for erase decoding according to an embodiment of the invention. The example of FIG. 7 shows PDFs 700 and 702 for sampling an LSB page of a 3 bpc memory having four hard thresholds 704, 706, 708, 710, although other pages and bits-per-cell may be used.

In one example, two LSB read instructions may be used to find all cells conducted by a threshold value in a voltage window in close proximity to each hard decision threshold of an LSB page. Each of PDFs 700 and 702 show the sampling thresholds for a separate read instruction. The first read instruction may simultaneously sample the first two LSB thresholds 712, for example, placed below and above the first hard LSB threshold 704 and the next two LSB thresholds 714, for example, placed below and above the third hard LSB threshold 708, as shown on PDF 700. All cells read with a value '0' may be located near these thresholds. This process may be repeated for the second read instruction which may simultaneously sample the two LSB thresholds 716, for example, placed below and above the second hard LSB threshold 706 and the next two LSB thresholds 718, for example, placed below and above the fourth hard LSB threshold 710, as shown on PDF 702. A bitwise AND operation may be executed on the results of the two read instructions to generate the set of all reliable cells having a threshold value in close proximity to (e.g., in a predefined narrow voltage window surrounding) the hard threshold.

The combinations of thresholds evaluated in the read instructions may be changed, for example, to evaluate the $1^{st}$ and $2^{nd}$ hard thresholds 704 and 706 by simultaneously sampling thresholds 712 and 716 in the first read instruction and to evaluate $3^{rd}$ and $4^{th}$ hard thresholds 708 and 710 by simultaneously sampling thresholds 714 and 718 in the second read instruction. However, it is important to choose an order which is allowable by the different read thresholds. For example, in some devices fourth LSB threshold 710 has a minimum voltage (e.g., 2.55v). Accordingly, if the threshold 716 at the upper voltage limit of second hard threshold 706 is lower than the minimum voltage (e.g., 2.55v) of fourth LSB threshold 710, then first and third thresholds 704 and 708 may be evaluated before proceeding to evaluate second and the fourth thresholds 706 and 710. Other combinations of multiple thresholds from the set of erase thresholds 712, 714, 716, 718 may be used.

Embodiments of the invention may be implemented in combination with or adapted from embodiments described in U.S. patent application Ser. No. 12/667,386, filed Dec. 31 2009, entitled "Flash Memory Apparatus and Methods Using a Plurality of Decoding Stages Including Optional Use of Concatenated BCH Codes And/Or Designation Of "First Below" Cells."

Embodiments of the invention may provide methods, systems, and computer program products that accelerate the process of sampling a memory device for soft decoding, erase decoding, GMD decoding, LDPC decoding, etc., as compared to conventional systems. Accelerated sampling may be provided using native multi-bit read instructions sampling multiple thresholds in combinations and orders described by embodiments of the invention. The thresholds may be combined in each multiple threshold sampling operation according to a partition or labeling of the thresholds into groups. The manner in which the label values are set may determine the hard bit values of all the cells to be in a particular corresponding bit plane position.

Embodiments of the invention may be software-implemented using dedicated instruction(s) such as native multi-bit read instructions (e.g., stored in memory 102 of FIG. 1) or, alternatively, hardware-implemented using designated circuitry (e.g., circuitry 112-116 of FIG. 1), control module (e.g., control module 110 of FIG. 1) and/or logic arrays.

It may be appreciated that when used herein, "simultaneously" sampling multiple thresholds may refer to sampling each threshold using a single read instruction, a single memory access and/or in the same cycle (by a single processing core or thread). Since each threshold may be sampled by applying a unique voltage to a set of memory cells, the actual instance of the simultaneous samplings may vary by small time increments, for example, in a "rapid-fire" succession.

Soft sampling may refer to reading memory cells using a plurality of thresholds for each hard sampling threshold. A bin may refer to a set of cells which change their conductance within a given range of threshold voltages. A label may refer to a number which is assigned to each cell in a given bin.

Embodiments of the invention may include an article such as a computer or processor readable non-transitory storage medium, or a computer or processor storage medium, such as for example a memory, a disk drive, or a USB flash memory, for including or storing instructions which when executed by a processor or controller (for example, processor 104 of FIG. 1), carry out methods disclosed herein.

Different embodiments are disclosed herein. Features of certain embodiments may be combined with features of other embodiments; thus certain embodiments may be combinations of features of multiple embodiments.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

What is claimed is:

1. A method for reading memory cells in a memory device, the method comprising:
 receiving a set of thresholds for reading a current page of the memory cells;
 dividing the set of thresholds into a plurality of groups of thresholds; and
 simultaneously reading the current page using multiple thresholds, where each of the multiple thresholds is divided into a different group of thresholds.

2. The method of claim 1 comprising receiving a single multi-threshold read instruction defining the multiple thresholds to trigger simultaneously reading the multiple thresholds.

3. The method of claim 2, wherein the single multi-threshold read instruction is a native instruction in the memory device.

4. The method of claim 1 comprising iteratively reading the current page using different combinations of multiple thresholds until the current page is read with all thresholds in the set.

5. The method of claim 1, wherein simultaneously reading using multiple thresholds comprises reading using the multiple thresholds in a single read instruction, wherein during the single read instruction the current page is separately read using each individual threshold in rapid-fire succession.

6. The method of claim 1 comprising labeling thresholds differently in each group, wherein the simultaneously read multiple thresholds each have a different group label.

7. The method of claim 1, wherein each different label is assigned to a bin for a different bit value for one or more pages.

8. The method of claim 7, wherein the labels include a group value and a bin value.

9. The method of claim 1, wherein the simultaneously read multiple thresholds are separated by equally spaced voltage gaps.

10. The method of claim 1, wherein the simultaneously read multiple thresholds are separated by differently spaced voltage gaps.

11. The method of claim 1, wherein the thresholds in the set are divided at one or more hard decision thresholds for reading one or more pages.

12. The method of claim 11, wherein the current page is an LSB page and the thresholds in the set are divided at hard decision thresholds for MSB and CSB pages.

13. The method of claim 11, wherein the current page is an MSB page and the thresholds in the set are divided at hard decision thresholds for MSB and CSB pages.

14. The method of claim 1 comprising reading multiple pages of the memory cells in parallel.

15. The method of claim 1, wherein the set of thresholds includes hard decision thresholds and soft decision thresholds.

16. The method of claim 15, wherein the set of thresholds includes $2^N-1$ thresholds for generating N-bit resolution soft bit information.

17. The method of claim 1, wherein the set of thresholds includes hard decision thresholds and erase thresholds, wherein two erase thresholds surround each hard decision threshold to form a predefined voltage range of thresholds sufficiently close to the hard decision threshold surrounded thereby, wherein the erase thresholds are used to generate erase bit information indicating if cells are within the predefined voltage range.

18. The method of claim 17, comprising evaluating the reliability of one or more hard thresholds by simultaneously reading the current page using two erase thresholds surrounding each hard threshold and generating a set of reliable cells having a threshold value within the predefined voltage range.

19. The method of claim 18, comprising repeatedly reading the current page using erase thresholds surrounding all heard decision thresholds and operating on results from said repeatedly reading to generate a set of all reliable cells having a threshold value within the predefined voltage range.

20. The method of claim 1, wherein the multiple thresholds are simultaneously sampled to simultaneously compute the number of cells in multiple bins.

21. The method of claim 20 comprising:
 reading each page of the memory cells simultaneously using a first set of multiple thresholds with voltages equal to lower voltages of two or more of the multiple bins;
 counting the number of the memory cells in each page that conduct using the first set of multiple thresholds;
 reading each page of the memory cells simultaneously using a second set of multiple thresholds with voltages equal to upper voltages of the two or more bins;
 counting the number of the memory cells in each page that conduct using the second set of multiple thresholds; and determining the number of cell in each of the two or more bins to be the difference between the number of memory cells counted for each bin using the first and second sets of threshold values.

* * * * *